United States Patent
Sirinorakul et al.

(10) Patent No.: US 10,586,771 B2
(45) Date of Patent: Mar. 10, 2020

(54) CONDUCTIVE SHIELD FOR SEMICONDUCTOR PACKAGE

(71) Applicant: UTAC Thai Limited, Bangkok (TH)

(72) Inventors: Saravuth Sirinorakul, Bangkok (TH); Somchai Nondhasitthichail, Bangkok (TH)

(73) Assignee: UTAC HEADQUARTERS PTE, LTD, Singapore (SG)

( * ) Notice: Subject to any disclaimer, the term of this patent is extended or adjusted under 35 U.S.C. 154(b) by 0 days.

(21) Appl. No.: 14/571,036

(22) Filed: Dec. 15, 2014

(65) Prior Publication Data
US 2015/0171022 A1 Jun. 18, 2015

Related U.S. Application Data

(60) Provisional application No. 61/916,712, filed on Dec. 16, 2013.

(51) Int. Cl.
| H01L 21/56 | (2006.01) |
| H01L 21/78 | (2006.01) |
| H01L 23/60 | (2006.01) |
| H01L 23/552 | (2006.01) |
| H01L 23/00 | (2006.01) |

(Continued)

(52) U.S. Cl.
CPC .......... *H01L 23/552* (2013.01); *H01L 21/561* (2013.01); *H01L 21/78* (2013.01); *H01L 23/3135* (2013.01); *H01L 24/97* (2013.01); *H01L 21/6836* (2013.01); *H01L 23/3121* (2013.01); *H01L 24/32* (2013.01); *H01L 24/48* (2013.01); *H01L 24/73* (2013.01); *H01L 24/92* (2013.01); *H01L 2221/68327* (2013.01); *H01L 2224/32225* (2013.01); *H01L 2224/32245* (2013.01); *H01L 2224/48091* (2013.01); *H01L 2224/48229* (2013.01); *H01L 2224/48235* (2013.01); *H01L 2224/48237* (2013.01); *H01L 2224/48247* (2013.01); *H01L 2224/48249* (2013.01); *H01L 2224/48257* (2013.01); *H01L 2224/48463* (2013.01); *H01L 2224/48465* (2013.01); *H01L 2224/73265* (2013.01); *H01L 2224/92247* (2013.01); *H01L 2224/97* (2013.01); *H01L 2924/00014* (2013.01); *H01L 2924/12042* (2013.01); *H01L 2924/15313* (2013.01); *H01L 2924/181* (2013.01)

(58) Field of Classification Search
CPC ....... H01L 23/552; H01L 21/56; H01L 21/78; H01L 23/00; H01L 23/31; H01L 23/60
See application file for complete search history.

(56) References Cited

U.S. PATENT DOCUMENTS

| 4,827,376 A * | 5/1989 | Voss ........................ H01L 23/42 257/E23.034 |
| 6,420,776 B1 * | 7/2002 | Glenn ................. H01L 21/3043 257/620 |
| 7,714,418 B2 | 5/2010 | Lim |

(Continued)

*Primary Examiner* — Joseph C. Nicely
*Assistant Examiner* — Lamont B Koo
(74) *Attorney, Agent, or Firm* — Haverstock & Owens LLP

(57) ABSTRACT

A conductive polymer shielding layer covering insulating layer formed on an integrated-circuit die is provided and a method thereof. The method comprises die attaching, wire bonding, back etching, insulation molding, partial cutting, conductive material/polymer coating, and singulation.

20 Claims, 5 Drawing Sheets

(51) Int. Cl.
*H01L 23/31* (2006.01)
*H01L 21/683* (2006.01)

(56) References Cited

U.S. PATENT DOCUMENTS

| | | | |
|---|---|---|---|
| 2001/0008305 A1* | 7/2001 | McLellan | H01L 21/4832 |
| | | | 257/692 |
| 2001/0009301 A1* | 7/2001 | Azuma | H01L 21/4832 |
| | | | 257/698 |
| 2002/0125550 A1 | 9/2002 | Estacio | |
| 2008/0265421 A1* | 10/2008 | Brunnbauer | H01L 21/561 |
| | | | 257/758 |
| 2009/0039530 A1* | 2/2009 | Fryklund | H01L 21/6835 |
| | | | 257/778 |
| 2009/0294928 A1* | 12/2009 | Kim et al. | 257/659 |
| 2009/0302435 A1* | 12/2009 | Pagaila | H01L 21/561 |
| | | | 257/659 |
| 2010/0207258 A1* | 8/2010 | Eun et al. | 257/660 |
| 2010/0207259 A1* | 8/2010 | Liao | H01L 21/6835 |
| | | | 257/660 |
| 2011/0115066 A1* | 5/2011 | Kim | H01L 21/561 |
| | | | 257/690 |
| 2012/0146163 A1* | 6/2012 | Ho | B81C 1/0023 |
| | | | 257/416 |
| 2012/0241922 A1* | 9/2012 | Pagaila | 257/659 |
| 2012/0295085 A1* | 11/2012 | Iida | B32B 27/34 |
| | | | 428/212 |
| 2012/0295484 A1 | 11/2012 | Sato | |
| 2014/0167232 A1* | 6/2014 | LoBianco et al. | 257/659 |
| 2016/0174374 A1 | 6/2016 | Kong | |

* cited by examiner

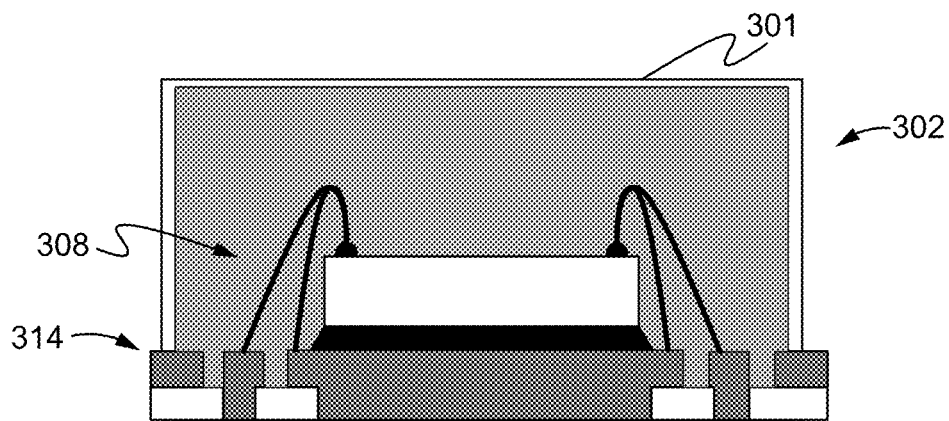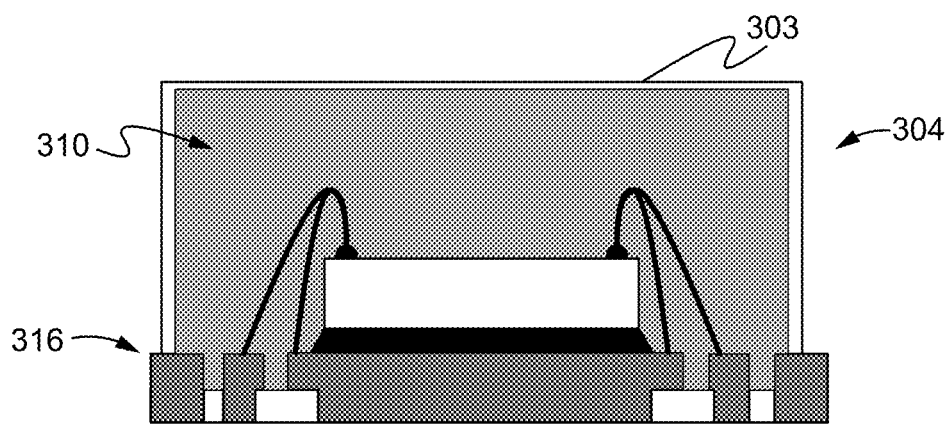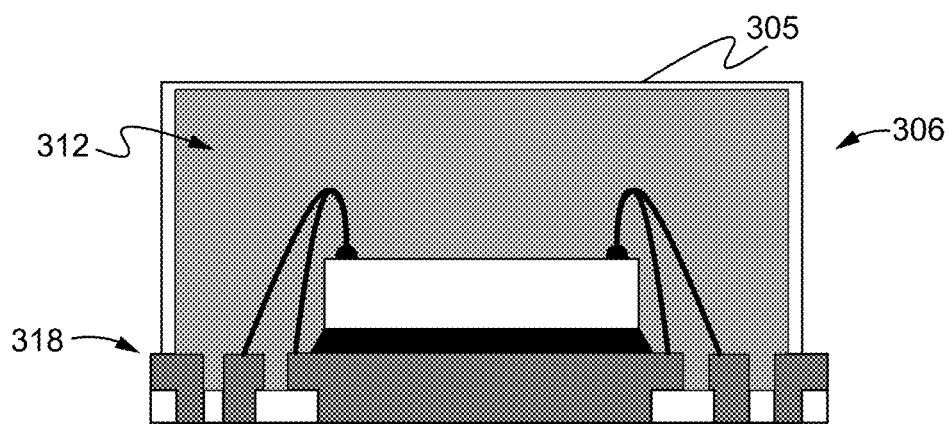
Fig. 3A

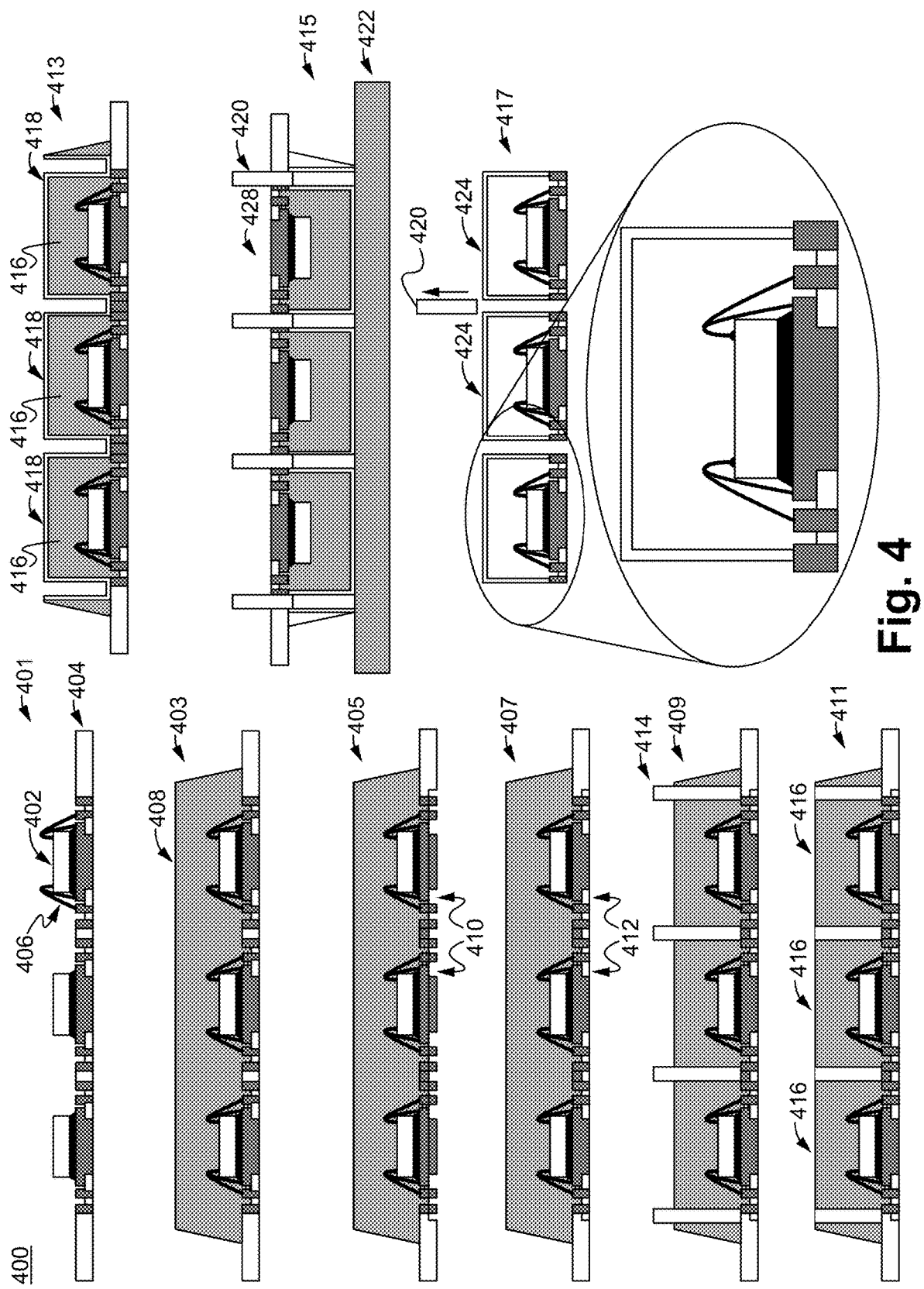

US 10,586,771 B2

CONDUCTIVE SHIELD FOR SEMICONDUCTOR PACKAGE

CROSS-REFERENCE TO RELATED APPLICATION(S)

This application claims priority under 35 U.S.C. § 119(e) of the U.S. Provisional Patent Application Ser. No. 61/916,712, filed Dec. 16, 2013 and titled, "CONDUCTIVE SHIELD FOR SEMICONDUCTOR PACKAGE," which is hereby incorporated by reference in its entirety for all purposes.

FIELD OF THE INVENTION

The present invention relates to semiconductor packaging. More specifically, the present invention relates to protective elements for the semiconductor packaging.

BACKGROUND OF THE INVENTION

Most of radio frequency (RF) electronics components require electromagnetic interference (EMI) shielding. Conventional packages use metal lids or cans for the shielding. However, the metal lid has disadvantages in terms of the size density and costs. FIG. 1 illustrates a conventional package with a metal lid 102 coupling with an electronic component 104.

SUMMARY OF THE INVENTION

In some embodiments, a semiconductor package with a conductive polymer shielding on the molding compound is provided. The conductive polymer can be a layer of coating material formed as the EMI shield.

In an aspect, a method of forming a conductive shield comprises forming a conductive layer covering an integrated circuit die (hereinafter "die"). In some embodiments, the method further comprises screen-printing to form the conductive layer. In other embodiments, the method further comprises coating to form the conductive layer. In some other embodiments, the method comprises dipping or spraying coating. In some embodiments, the method further comprises molding a molding material over the integrated circuit die. In some other embodiments, the method further comprises back etching. In some embodiments, the method further comprises molding an insulation layer. In other embodiments, the method further comprises partial cutting before forming the conductive layer. In some other embodiments, the method further comprises fully singulation after forming the conductive layer. In some other embodiments, the conductive layer comprises a polymer. In some embodiments, the polymer comprises a conductive polymer. In some embodiments, the method further comprises attaching an integrated circuit die. In other embodiments, the method further comprises performing wire bonding.

In another aspect, a die protective device comprising a conductive polymer enclosing an insulating layer formed over a die. In some embodiments, the device further comprises a molding material between the conductive polymer and the die (an integrated circuit die). In other embodiments, the conductive polymer forms a Farady cage. In some other embodiments, the conductive polymer comprises a cuboid body. In some embodiments, the conductive polymer comprises conductive polyurethane. In other embodiments, the conductive polymer comprises conductive polyimide.

In another aspect, a method of forming a semiconductor package comprises attaching one or more dies, wire bonding, encapsulating the dies and wires by molding with an electrically insulating molding material, forming a partially cut unit, forming a conductive layer over the partially cut unit, and fully singulating.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

FIG. 3A illustrates semiconductor packages in accordance with some embodiments of the present invention.

FIG. 4 illustrates a packing forming process in accordance with some embodiments of the present invention.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
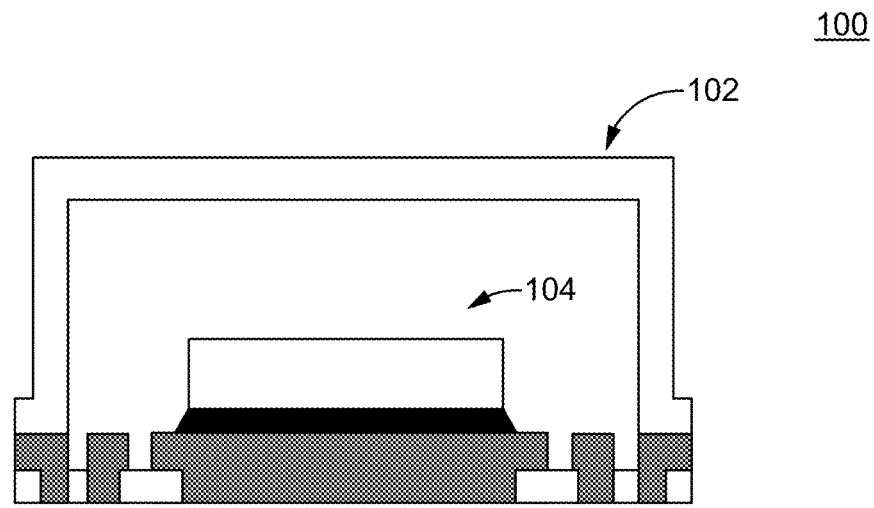
FIG. 1 illustrates a conventional package with a metal lid coupling with an electronic component.
Figure 2:
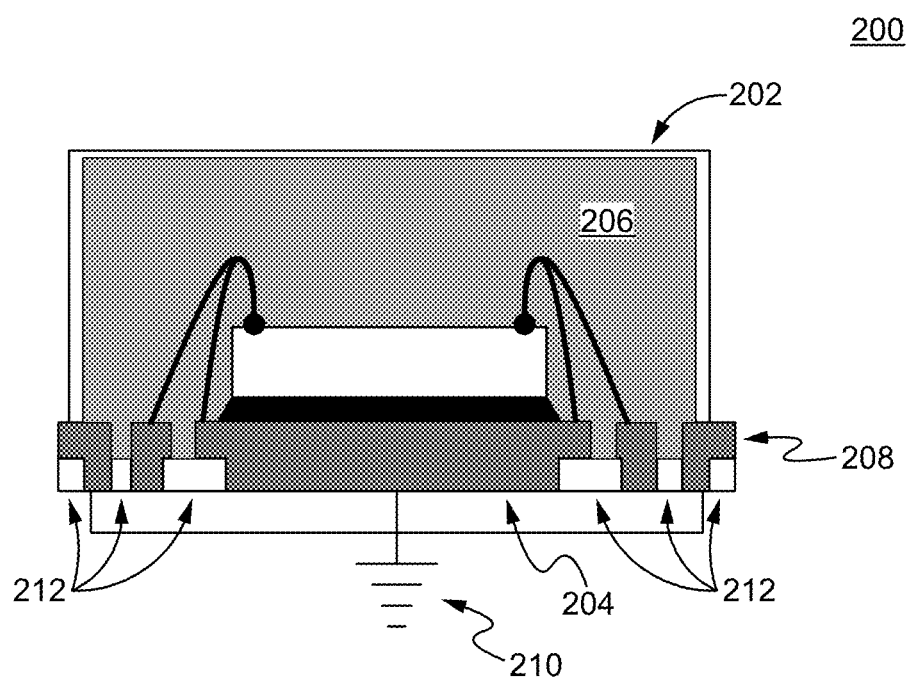
FIG. 2 illustrates a semiconductor package in accordance with some embodiments of the present invention.

FIG. 2 illustrates a semiconductor package 200 in accordance with some embodiments of the present invention. In some embodiments, the package 200 has electronic components 204 coupled with a molding material 206 and a ground ring 208 couples with the ground 210. A protective layer 202 can be formed over the molding material 206. The electronic components 204 can be coupled with a PCB ground 210. In some embodiments, insulating materials 212 encloses the package 200.

In some embodiments, the protective layer 202 comprises a conductive polymer. A person of ordinary skill in the art appreciates that any other conductive materials are able to be used to form the protective layer 202. In some embodiments, the protective layer 202 provides a Faraday cage effect, which forms an enclosure blocking a transmission or reception of radio frequency waves and any other types of electromagnetic radiation, such as a radio frequency interference (RFI).

FIG. 3A illustrates semiconductor packages 300 in accordance with some embodiments of the present invention. In some embodiments, the semiconductor packages 300 comprises package 302, 304, and 306, which have conductive shields 301, 303, and 305 respectively. The conductive shields 301, 303, and 305 can be coated on the packages 302, 304, and 306. The conductive shields 301, 303, and 305 can encapsulate the molding compounds 308, 310, and 312, such as formed on a Land Grid Array (LGA) package. In some embodiments, the semiconductor packages 300 comprises series feature ground ring structures 314, 316, and 318.

Figure 3B:
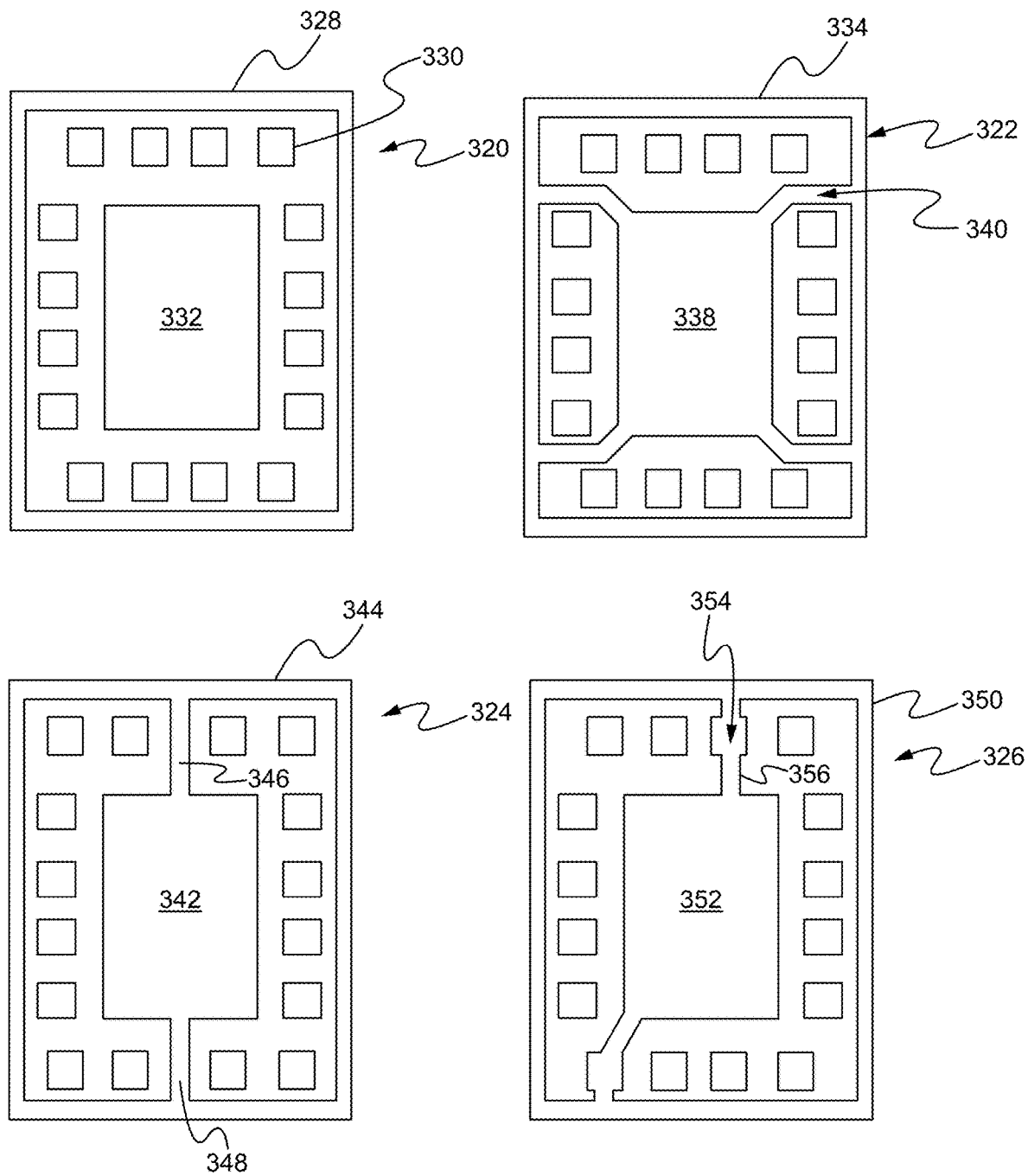
FIG. 3B illustrates exemplary ground ring structures in accordance with some embodiments of the present invention.

FIG. 3B illustrates exemplary ground ring structures in accordance with some embodiments of the present invention. In some embodiments, the ground ring can be grounded by PCB circuit and/or wire bond in the semiconductor package. A first exemplary ground ring structure 320 comprises a ground ring 328 having no connection with a ground paddle 332 and no connection with the device pin 330. A second exemplary ground ring structure 322 comprises a ground ring 322 coupled with a ground paddle 338. The coupling between the ground ring 322 coupled and the ground paddle 338 can be through the connections 340, which form conductive channels to the two sides of the ground ring 322. A third exemplary ground ring structure 324 comprises a ground ring 344 coupling with a ground paddle 342 via a top connecting channel 346 and a bottom connecting channel 348. A fourth exemplary ground ring structure 326 comprises a ground ring 350 coupling with a ground paddle 352 and device pin 354 via one or more connecting channels 356. The exemplary ground ring structures 320, 322, 324, and 326 are bottom view/terminal views of the semiconductor packages. A person of ordinary skill in the art appreciates that various ground ring structures are within the scope of the present invention. Different connecting patterns can be formed based on specific functions as needed, such as the thickness and the shape of the shield.

FIG. 4 illustrates a package forming process 400 in accordance with some embodiments of the present invention. At Step 401, one or more dies 402 are attached to the PCB 404. Wire bonding is performed to form the wires 406. At Step 403, molding is performed to encapsulate the dies and wires inside a molding material 408. At Step 405, back etching is performed on the surface of the molding material 408 forming a back etched surface 410. At Step 407, insulation molding is performed to form an insulation layer 412 on the back etched surface 410. At Step 409, a cutting tool 414, such as saw or laser, is used to partially cut the package. At Step 411, individual and partially cut molded array 416 are formed. At Step 413, screen-printing or dipping/spraying coating are used to form a layer of conductive coating 418 on the molded array 416. The conductive coating 418 can be formed of conductive polymers (such as conductive polyurethane and polyimide) or metallic materials. At Step 415, a $2^{nd}$ singulation procedure is performed. The molded array with a layer of conductive coating is flipped to be attached with a singulation dicing tape 422. A tool 420 is used to fully cut the molded array forming individual unit 428. At Step 417, the removal of the tool 420 forms finished units 424.

Figure 5:
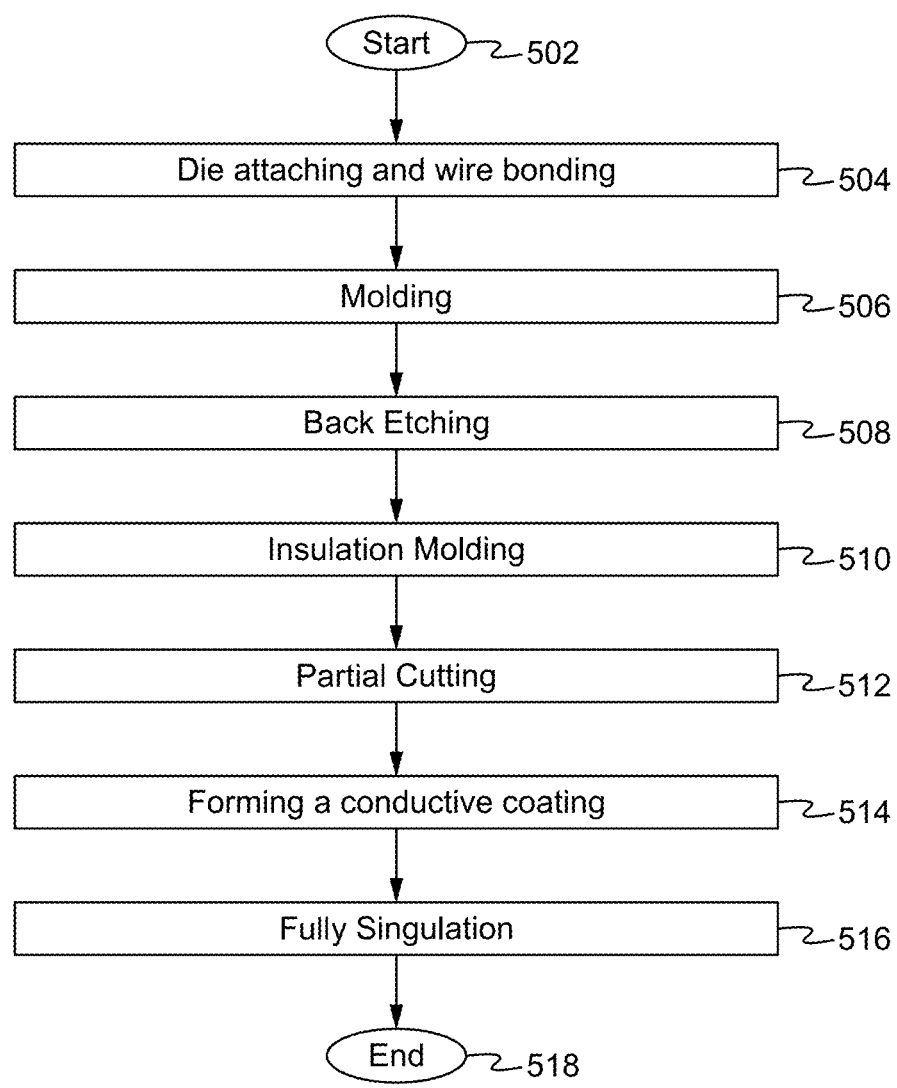
FIG. 5 is a flow chart illustrating a conductive shield forming process in accordance with some embodiments of the present invention.

FIG. 5 is a flow chart illustrating a conductive shield forming process 500 in accordance with some embodiments of the present invention. The method 500 can start at Step 502. At Step 504, dies are attached and wires are bonded to a PCB. At Step 506, molding is performed. At Step 508, back etching is performed. At Step 510, insulation molding is performed. At Step 512, partial cutting is performed. At Step 514, a conductive coating is formed. At Step 516, fully singulation is performed. The method can stop at Step 518.

The conductive polymer shield can be utilized to shield and prevent electromagnetic interference.

In operation, the conductive polymer shield provide a function as a Farady cage, which results from an external static electric field causing the electric charges within the cage's conducting material to be distributed such that the field's effect in the cage interior is cancelled.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A method of forming a conductive shield comprising:
coupling multiple dies on a first surface of a substrate;
forming an insulating layer along a contour of each of the multiple partially individualized packages encapsulated by a molding material that are separated by gaps, wherein the molding material is in the insulating layer that is formed over each of a plurality of dies of the multiple partially individualized packages;
back etching away portions on a second side of the substrate, wherein the back etching away of portions on the second side of the substrate forms from remaining portions of the substrate, a ground ring, and a plurality of device pins that is surrounded by the ground ring;
filling the etched-away portions with insulating material thereby forming an insulated substrate, wherein the insulating material in the etch-away portions abuts the molding material, wherein the etching away portions on the second side of the substrate forms the ground ring and the plurality of device pins that is surrounded by the ground ring;
forming a conductive layer along a contour of each of the multiple semi-individualized packages covering an entire outer surface of the insulating layer without completely filling the recesses, wherein the conductive layer comprises conductive polyimide, wherein each of the recesses extends an entire depth of the insulating layer along a straight line; and
coupling a singulation dicing tape over the multiple semi-individualized packages and enclosing openings of the recesses, wherein the dicing tape is directly coupled with the conductive layer.

2. The method of claim 1, further comprising screen-printing to form the conductive layer.

3. The method of claim 1, further comprising dipping to form the conductive layer.

4. The method of claim 1, further comprising spraying to form the conductive layer.

5. The method of claim 1, further comprising fully singulating after forming the conductive layer.

6. The method of claim 1, further comprising performing wire bonding.

7. The method of claim 1, wherein the etching away of portions on the second side of the substrate also forms a ground paddle, wherein the ground ring is coupled with at least one of the plurality of device pins via a connecting channel.

8. The method of claim 1, wherein the etching away of portions on the second side of the substrate also forms a ground paddle, wherein the ground ring is coupled with the ground paddle via a connecting channel.

9. A die protective device comprising a conductive polymer formed along a contour of each of multiple partially individualized packages encapsulated by a molding material that are separated by gaps in an insulating layer that is formed over a plurality of dies of the packages, wherein the insulated layer includes etched-away portions filled with an insulating material, wherein the insulating material in the etch-away portions abuts the molding material, wherein the etching away portions on the second side of the substrate forms a ground ring and a plurality of device pins that is surrounded by the ground ring, wherein each of the gaps extends an entire depth of the insulating layer along a straight line, and a singulation dicing tape over the multiple partially individualized packages and enclosing openings of the gaps in the insulating layer, wherein the dicing tape is directly coupled with the conductive polymer.

10. The device of claim 9, wherein the conductive polymer forms a Farady cage.

11. The device of claim 9, wherein the conductive polymer comprises a cuboid body.

12. The device of claim 9, wherein the conductive polymer comprises conductive polyurethane.

13. The device of claim 9, wherein the etched away portions also form a ground paddle, wherein the ground ring is coupled with at least one selected from at least one of the plurality of device pins and the ground paddle, via a connecting channel.

14. A method of forming a semiconductor package comprising:
attaching one or more dies attached to a first side of a substrate;
wire bonding;
encapsulating the dies and wires with an electrically insulating molding material;
etching away portions on a second side of the substrate;
filling the etched-away portions with insulating material thereby forming an insulated substrate, wherein the insulating material in the etch-away portions abuts the molding material, wherein the etching away of portions on the second side of the substrate forms a ground ring and a plurality of device pins that is surrounded by the ground ring;
forming recesses in the molding material to thereby form partially individualized packages;
forming a conductive layer along a contour of each of the partially individualized packages without filling the recesses, wherein the conductive layer comprises conductive polyimide and covers an entire outer surface of the molding material, wherein each of the recesses extends an entire depth of the insulating layer along a straight line;
coupling a singulation dicing tape over the partially individualized packages and enclosing openings of the recesses in the molding material, wherein the dicing tape is directly coupled with the conductive layer; and
fully singulating.

15. The method of claim 14, wherein the etching away of portions on the second side of the substrate also forms a ground paddle.

16. The method of claim 15, wherein the ground ring is coupled with at least one of the plurality of device pins via a connecting channel.

17. The method of claim 15, wherein the ground ring is coupled with the ground paddle via a connecting channel.

18. The method of claim 14, further comprising screen-printing to form the conductive layer.

19. The method of claim 14, further comprising dipping to form the conductive layer.

20. The method of claim 14, further comprising spraying to form the conductive layer.

* * * * *